United States Patent
Watanbe et al.

(10) Patent No.: US 9,153,770 B2
(45) Date of Patent: Oct. 6, 2015

(54) MAGNETORESISTIVE ELEMENT AND MAGNETIC MEMORY

(71) Applicant: Kabushiki Kaisha Toshiba, Tokyo (JP)

(72) Inventors: Daisuki Watanbe, Yamanashi (JP); Katsuya Nishiyama, Kanagawa (JP); Toshihiko Nagase, Tokyo (JP); Koji Ueda, Fukuoka (JP); Tadashi Kai, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 31 days.

(21) Appl. No.: 13/785,952

(22) Filed: Mar. 5, 2013

(65) Prior Publication Data
US 2013/0299929 A1    Nov. 14, 2013

(30) Foreign Application Priority Data
May 8, 2012 (JP) .................. 2012-106611

(51) Int. Cl.
| | |
|---|---|
| *H01L 43/02* | (2006.01) |
| *H01L 43/12* | (2006.01) |
| *H01L 43/08* | (2006.01) |
| *H01L 43/10* | (2006.01) |
| H01L 27/22 | (2006.01) |

(52) U.S. Cl.
CPC ............... *H01L 43/02* (2013.01); *H01L 43/08* (2013.01); *H01L 43/10* (2013.01); *H01L 43/12* (2013.01); *H01L 27/228* (2013.01)

(58) Field of Classification Search
CPC . H01L 27/11507; H01L 27/228; H01L 43/08; H01L 27/11502; H01L 28/65; H01L 28/75; H01L 28/91
USPC .................. 257/421–427; 365/158
See application file for complete search history.

(56) References Cited

U.S. PATENT DOCUMENTS

| | | | |
|---|---|---|---|
| 2009/0080238 A1 | 3/2009 | Yoshikawa et al. | |
| 2010/0080050 A1 | 4/2010 | Ozeki et al. | |
| 2011/0073970 A1* | 3/2011 | Kai et al. ....................... | 257/421 |
| 2011/0222335 A1* | 9/2011 | Yoshikawa et al. ............ | 365/158 |
| 2011/0228596 A1* | 9/2011 | Inokuchi et al. ............... | 365/158 |
| 2012/0069640 A1* | 3/2012 | Nagase et al. .................. | 365/158 |
| 2012/0088125 A1 | 4/2012 | Nishiyama et al. | |
| 2012/0099369 A1 | 4/2012 | Kai et al. | |
| 2013/0028013 A1 | 1/2013 | Ikeda et al. | |

FOREIGN PATENT DOCUMENTS

JP     2010-080746 A    4/2010

* cited by examiner

*Primary Examiner* — David Vu
*Assistant Examiner* — Jonathan Han
(74) *Attorney, Agent, or Firm* — Patterson & Sheridan, LLP

(57) ABSTRACT

A magnetoresistive element includes a first magnetic layer having an axis of magnetization perpendicular to the film surface and a fixed magnetization orientation; a second magnetic layer having an axis of magnetization perpendicular to the film surface and a changeable magnetization orientation; a first nonmagnetic layer arranged between the first and second magnetic layers; and a third magnetic layer having an axis of magnetization perpendicular to the film surface and a fixed magnetization orientation opposite that of the first magnetic layer. The first magnetic layer has a first magnetic material film in contact with the first nonmagnetic layer, a nonmagnetic material film in contact with the first magnetic material film, and a second magnetic material film containing $Co_{100}$-xWx (0<x<40 at %) and in contact with the nonmagnetic material film. As current flows via the nonmagnetic layer, the magnetization orientation of the second magnetic layer changes.

16 Claims, 12 Drawing Sheets

TO THE FIRST MAGNETORESISTIVE DATA
REWRITE CONTROL SECTION

TO THE FIRST MAGNETORESISTIVE DATA REWRITE
CONTROL SECTION

MAGNETORESISTIVE ELEMENT AND MAGNETIC MEMORY

CROSS-REFERENCE TO RELATED APPLICATION

This application is based upon and claims the benefit of priority from Japanese Patent Application No. 2012-106611, filed May 8, 2012; the entire contents of which are incorporated herein by reference.

FIELD

Embodiments described herein relate to a magnetoresistive element and a magnetic memory.

BACKGROUND

In recent years, as the next-generation solid state nonvolatile memory capable of carrying out operation with high speed read/write, high capacity, and low power consumption, people have paid much attention to magnetic random access memory (hereinafter to be referred to as MRAM) exploiting the magnetoresistive effect of a ferromagnetic material.

In particular, magnetoresistive elements having a ferromagnetic tunnel junction have attracted much attention as they have been found to demonstrate a significant ability to change magnetoresistivity. The ferromagnetic tunnel junction has a 3-layer laminated structure including a memory layer where the magnetization direction is changeable, an insulator layer, and a fixing layer that maintains a prescribed or intended magnetization direction in the memory layer.

A magnetoresistive element having a ferromagnetic tunnel junction is also called a magnetic tunnel junction (MTJ). People have proposed using a spin injection write system using spin momentum transfer (SMT) as the memory write system for MTJ's.

According to the spin injection write system, as a spin polarization current flows in the magnetoresistive element, the magnetization direction of the element is inverted. As a consequence, the volume of the magnetic layer needed to form the memory layer decreases and thus the current to inject spin polarization electrons decreases. Consequently, it is expected that a spin injection based writing system may have both very small memory cell and unit size and low current requirements for switching.

The ferromagnetic material that forms the magnetoresistive element may be the so-called vertical magnetization film, a film having a simple axis of magnetization.

When crystal magnetic anisotropy is exploited in the constitution of the vertical magnetization type, shape magnetic anisotropy is not exploited, so that the size of the element can be smaller than the in-plane magnetization type. Also, as the dispersion in the easy axis of magnetization is small, by adopting a material with a high crystal magnetic anisotropy, it is possible to realize both finer structure and lower current while maintaining a high resistance to thermal disturbance.

Usually, the magnetostatic stray field generated of the reference layer in the MTJ element where the memory layer and the reference layer are of the vertical magnetization type is higher than that of the MTJ element of the in-plane magnetization type.

Also, a memory layer with a coercive force lower than that of the reference layer is significantly influenced by the leak magnetic field of the reference layer. More specifically, under the influence of the magnetostatic stray field of the reference layer, thermal stability degrades, and switching current value and its range increase. This is undesirable.

DETAILED DESCRIPTION

Embodiments of the present disclosure provide a magnetoresistive element using a spin injection write system that can decrease the switching current value and its range as well as a magnetic memory using the magnetoresistive element.

The magnetoresistive element in an embodiment of the present disclosure has a first magnetic layer having a simple axis of magnetization in a direction perpendicular to the film surface and the magnetization orientation is fixed in that direction; a second magnetic layer having a simple axis of magnetization in a direction perpendicular to the film surface and the orientation is changeable magnetization orientation; a first nonmagnetic layer arranged between the first magnetic layer and the second magnetic layer; and a third magnetic layer having a simple axis of magnetization in a direction perpendicular to the film surface in a direction opposite the magnetic orientation that of the first magnetic layer and fixed in that direction.

Here, the first magnetic layer has a laminated structure of a first magnetic material film arranged in contact with the first nonmagnetic layer, a nonmagnetic material film arranged in contact with the first magnetic material film, and a second magnetic material film containing $Co_{100-x}W_x$ (0<x<40 at %), $Co_{100-y}Hf_y$ (0<y<60 at %), or $Co_{100-z}Ta_z$ (0<z<40 at %) and arranged in contact with the nonmagnetic material film.

When a current flows, via the first nonmagnetic layer, between the first magnetic layer and the second magnetic layer, the magnetization orientation of the second magnetic layer changes.

First Embodiment

Figure 1:
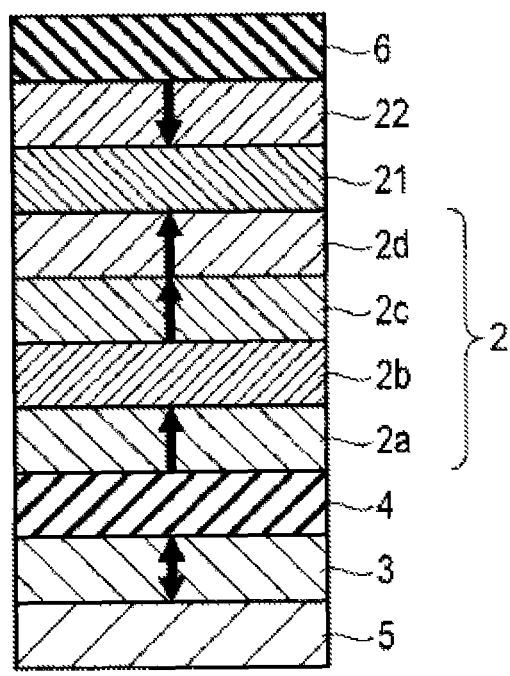
FIG. 1 is a cross-sectional view illustrating the magnetoresistive element according to a first embodiment.

FIG. 1 is a cross-sectional view illustrating the magnetoresistive element according to the first embodiment.

In the cross-sectional view of FIG. 1 and hereafter, arrows indicate the magnetization direction of the magnetic film layers. In the present specification and claims, the magnetoresistive element refers to the MR (tunnel magnetoresistive) element using a semiconductor or an insulator as a tunnel barrier layer. The constitution shown in the figure may also contain additional layers.

A magnetoresistive element 1 carries out a write operation by using the spin injection magnetization inversion effect. That is, corresponding to the direction of the spin polarization current flowing perpendicular to the film surface of the various layers, the relative angle of the magnetization of the memory layer and the fixed layer changes between parallel (magnetized in some direction) and anti-parallel (magnetized in opposed directions) states (that is, the minimum and maximum resistance states) corresponding to the "0" and "1" states of a binary memory, permitting information storage therein.

As shown in FIG. 1, the magnetoresistive element 1 has magnetic layers 2, 3 and 22 made of a ferromagnetic material, a nonmagnetic layer 4 arranged between the magnetic layer 2 and the magnetic layer 3, and a nonmagnetic layer 21 arranged between the magnetic layer 2 and the magnetic layer 22.

The magnetic layer 2 has a simple axis of magnetization perpendicular to the film surface and the magnetization direction of the magnetic layer 2 is fixed. Here, fixing of the magnetization direction means no change in the magnetization direction from before write to after write. In the following, the magnetic layer 2 is called a fixed layer (magnetization fixed layer, reference layer, pin layer, standard layer, or magnetization standard layer). The magnetic layer 2 in the present embodiment has a structure in which the following layers are laminated sequentially, from the side in contact with the nonmagnetic layer 4, a first magnetic material film 2a, a nonmagnetic material film 2b, a second magnetic material film 2c, and a third magnetic material film 2d. The detailed properties of the magnetic layer 2 will be explained later.

The magnetic layer 3 is arranged on a base layer 5 and has a simple axis of magnetization perpendicular to the film surface and a changeable magnetization direction. Here, changeable magnetization direction means that the magnetization direction can be changed from before write to after write. According to the present specification, the film surface refers to the upper surface of the layer concerned. In the following, the magnetic layer 3 will be called memory layer (it is also known as a free layer, magnetization free layer, magnetization changeable layer, or memory layer). The detailed properties of the magnetic layer 3 will be explained later.

The magnetic layer 22 is a vertical magnetization film having a simple axis of magnetization perpendicular to the film surface and a magnetization direction fixed in the direction opposite the magnetization direction of the fixed layer 2, and is formed over a nonmagnetic layer 21 which is formed on fixed layer 2 The magnetic layer 22 provides an opposed direction magnetic field to offset the inversion characteristics of the memory layer caused by a magnetostatic stray field of the magnetic layer 2 that becomes an issue when the size of the magnetoresistive elements becomes smaller (shrink), that is, it has the effect of relaxing and adjusting the shift in the switching current of the magnetic layer 3 by the magnetostatic stray field of the fixed layer 2. In the following, the magnetic layer 22 will be referred to as the bias layer (shift layer, shift relaxing layer, or shift adjusting layer). The detailed properties of the magnetic layer 22 and the nonmagnetic layer 21 will be explained in greater detail later.

Magnetization perpendicular to the film surface is called vertical magnetization. In FIG. 1, as an example, the magnetization direction of the magnetic layer 2 is shown as opposite (upward) that of the substrate (not shown in the figure) arranged below the base layer 5. However, it may alternatively be directed towards the substrate (downward).

The nonmagnetic layer 4 is also called a tunnel barrier layer. It is composed of an insulating film made of oxide or the like. More detailed properties of the nonmagnetic layer 4 will be explained later.

The magnetoresistive element 1 in the present embodiment is a magnetoresistive element adopted in a spin injection write system. That is, in the write operation, a current perpendicular to the film surface flows from the magnetic layer 2 to the magnetic layer 3 or from the magnetic layer 3 to the magnetic layer 2. Consequently, electrons having spin information are injected from the fixed layer 2 to the memory layer 3. The spin angular momentum of the injected electrons is transferred to the electrons of the memory layer 3 according to the law of conservation of spin angular momentum so that the magnetization of the memory layer 3 is inverted.

For example, when the magnetization direction of the memory layer 3 and the magnetization direction of the fixed layer 2 are anti-parallel with each other, a current flows from the memory layer 3 to the fixed layer 2. In this case, the electrons flow from the fixed layer 2 to the memory layer 3. As such, the electrons that have been spin polarized by the fixed layer 2 flow through the nonmagnetic layer 4 to the memory layer 3, and, as their spin angular momentum is transferred to the magnetic layer 3, the magnetization direction of the magnetic layer 3 is inverted to a direction parallel, (in the same direction as) with that of the magnetization direction of the fixed layer 2.

On the other hand, when the magnetization direction of the memory layer 3 is the same as the magnetization direction of the fixed layer 2, a current flows from the fixed layer 2 to the memory layer 3. In this case, the electrons flow from the memory layer 3 to the fixed layer 2. As such, electrons that have been spin polarized by the fixed layer 2 flow through the fixed layer 2. However, electrons having spin opposite to the magnetization direction of the fixed layer 2 are reflected from the interface between the nonmagnetic layer 4 and the fixed layer 2 and then flow through the nonmagnetic layer 4 to the memory layer 3. As a result, their spin angular momentum is transferred to the magnetic layer 3, so that the magnetization direction of the magnetic layer 3 is inverted to the direction anti-parallel i.e., opposed to the magnetization direction of the fixed layer 2.

When information is read from the magnetoresistive element 1, the read current flows without inversion of the magnetization of the magnetic layer 3 through the nonmagnetic layer 4 between the memory layer 3 and the fixed layer 2. As a result, it is possible to read the information from the magnetoresistive element 1.

The magnetoresistive element 1 of the first embodiment as shown in FIG. 1 has the so-called top-pin structure, in which the memory layer 3 is formed on the base layer 5, and the fixed layer 2 is formed on the nonmagnetic layer 4. The base layer 5 is adopted for controlling the crystallinity, such as the crystal orienting property, the crystal grain size, etc. of the layer above the magnetic layer 3. More detailed properties will be explained later. A cap layer 6 may also be formed on the fixed layer 2. The cap layer 6 is primarily provided to prevent oxidation of the magnetic layer, etc.

Second Embodiment

Figure 2:
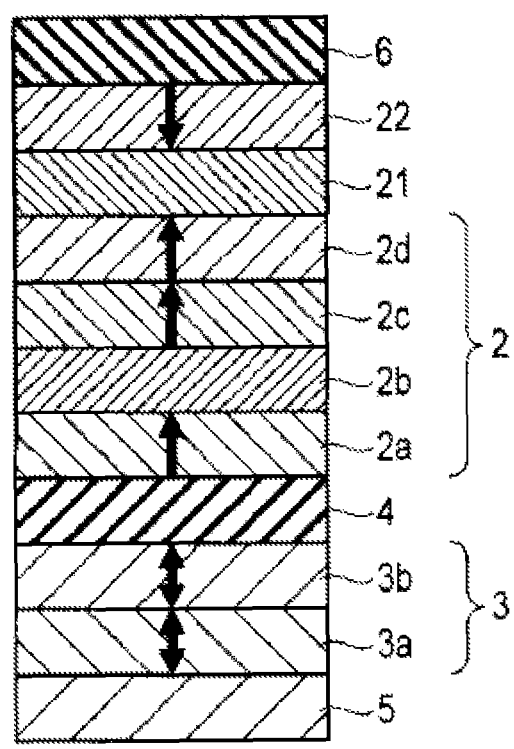
FIG. 2 is a cross-sectional view illustrating the magnetoresistive element according to a second embodiment.

FIG. 2 is a cross-sectional view illustrating the magnetoresistive element according to a second embodiment.

Like the magnetoresistive element 1 in the first embodiment shown in FIG. 1, the constitution of storage layer 3 of the magnetoresistive element 1 and 1A of the second embodiment includes, laminated together, a magnetic film 3a and an interface magnetic film 3b in contact with the nonmagnetic layer 4.

Because the interface magnetic film 3b is in contact with the nonmagnetic layer 4, it has the effect of relaxing lattice mismatch at the interface of the magnetic film 3a and the non-magnetic layer 4. In addition, since a material with a high spin polarization rate is used to form the interface magnetic film 3b, it is possible to realize a high tunnel magnetic resistance ratio (MR ratio) and a high spin injection efficiency. More detailed properties of the magnetic film 3a and the interface magnetic film 3b will be explained later.

In the present embodiment, a very thin nonmagnetic film may be arranged between the magnetic film 3a and the interface magnetic film 3b. A material that does not diffuse, even after heat treatment of the very thin nonmagnetic film, such as W or Ta, may be employed as the material for making the very thin nonmagnetic film. Thickness of the very thin nonmagnetic film may be 3±1 Å. Depending on the type of the material of the base layer 5, by arranging the very thin nonmagnetic film, it is possible to improve the vertical magnetic characteristics (thermal stability) and the MR ratio.

Third Embodiment

Figure 3:
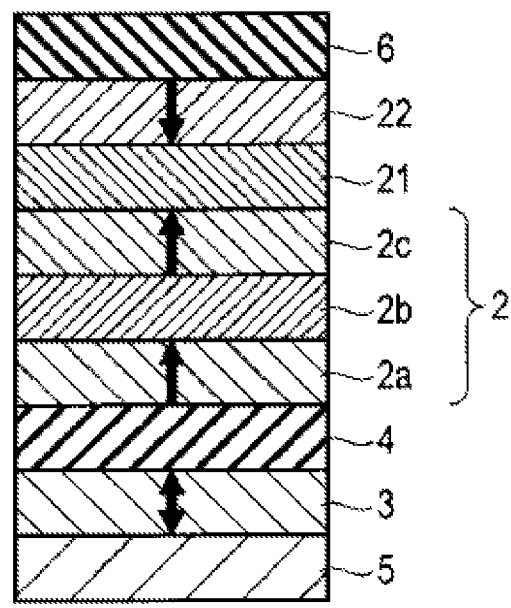
FIG. 3 is a cross-sectional view illustrating the magnetoresistive element according to a third embodiment.

FIG. 3 is a cross-sectional view illustrating the magnetoresistive element according to a third embodiment.

For the magnetoresistive element 1B in the third embodiment, the constitution is such that the third magnetic material film 2d contained in the fixed layer 2 is deleted from the magnetoresistive element 1 in the first embodiment shown in FIG. 1.

According to the present embodiment, the magnetization of the fixed layer 2 and the magnetic layer 22 are magnetically coupled with each other via the nonmagnetic layer 21 and their magnetizations are fixed in directions opposite each other, respectively. The magnetic layer 22 has the effect of relaxing and adjusting the shift in the inverted current of the memory layer 3 by the magnetostatic stray field of the fixed layer 2.

Fourth Embodiment

Figure 4:
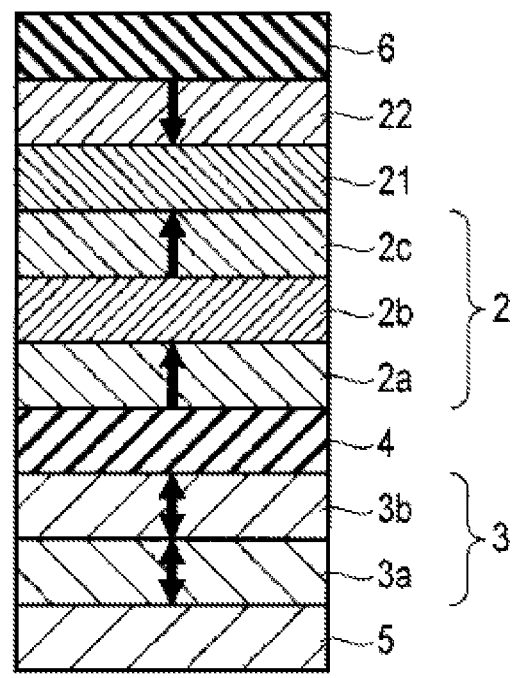
FIG. 4 is a cross-sectional view illustrating the magnetoresistive element according to a fourth embodiment.

FIG. 4 is a cross-sectional view illustrating the magnetoresistive element according to a fourth embodiment.

The magnetoresistive element 1C in the fourth embodiment has a constitution in which the third magnetic material film 2d contained in the fixed layer 2 is deleted from the magnetoresistive element 1A in the second embodiment shown in FIG. 2.

According to the present embodiment, the magnetization of the fixed layer 2 and that of the magnetic layer 22 are magnetically coupled with each other via the nonmagnetic layer 21 and their magnetizations are fixed in directions opposite each other, respectively. The remaining features of the constitution and the effects are the same as those of the fourth embodiment.

According to the first through the fourth embodiments, the constitution is the so-called top pin structure in which the memory layer 3 is formed on the base layer 5 and the fixed layer 2 is formed on the nonmagnetic layer 4. However, one may also adopt the so-called bottom pin structure in which the fixed layer 2 is formed on the fixed layer 5, and the memory layer 3 is formed on the nonmagnetic layer 4.

In addition, just as in the second embodiment, a very thin nonmagnetic film may be arranged between the magnetic film 3a and the interface magnetic film 3b. The material of this very thin nonmagnetic film may be the same as that employed in the second embodiment. According to this embodiment, by arranging the very thin nonmagnetic film, just as in the second embodiment, depending on the material of the base layer 5, it is possible to improve the vertical magnetic characteristics (thermal stability) and the MR ratio.

In the following, the various layers adopted in the first through the fourth embodiments will be explained in more detail.

[1] Memory Layer

First of all, the memory layers in the first through the fourth embodiments will be explained. When a vertical magnetic film is adopted as the memory layer 3, as explained above, shape magnetic anisotropy is not exploited, so that the element shape is smaller than that of the in-plane magnetization type, and, by using a material with a high vertical magnetic anisotropy, it is possible to realize both smaller structures and lower operating current while maintaining a high resistance to thermal disturbance than possible with in plane magnetization materials. In the following, the properties of the memory layer 3 and material selection will be explained in more detail with reference to examples.

(1) Properties Required on the Memory Layer

When a vertical magnetization material is adopted as memory layer 3, the thermal disturbance index Δ can be represented by the formula (1) from the ratio of the effective anisotropic energy (Kueff·V) to the thermal energy (kBT).

$$\Delta = Kueff \cdot V/(kBT)$$

$$= (Ku - 2\pi NMS2) \cdot Va/(kBT) \quad (1)$$

where,

Kueff: Effective vertical magnetization anisotropy
V: Volume of the vertical magnetization material
T: Temperature of the vertical magnetization material
kB: Boltzmann constant
Ku: Vertical magnetic anisotropy
MS: Saturated magnetization
N: Anti-magnetic field coefficient
Va: Magnetization inversion unit volume In order to avoid the problem of fluctuation in the magnetization due to thermal energy (thermal disturbance), it is preferred that the thermal disturbance index Δ be larger than 60. However, as the element size decreases in order to increase the capacity (number of memory elements per unit area of the memory device), if the film thickness becomes thinner, the magnetization inversion unit volume Va becomes smaller, and the memory (magnetic field direction) cannot be reliably maintained (=thermal disturbance) and the resulting memory device becomes instable. Consequently, for the memory layer 3, it is preferred that a material having a large vertical magnetic anisotropy Ku and/or a small saturated magnetization MS be selected.

Figure 5:
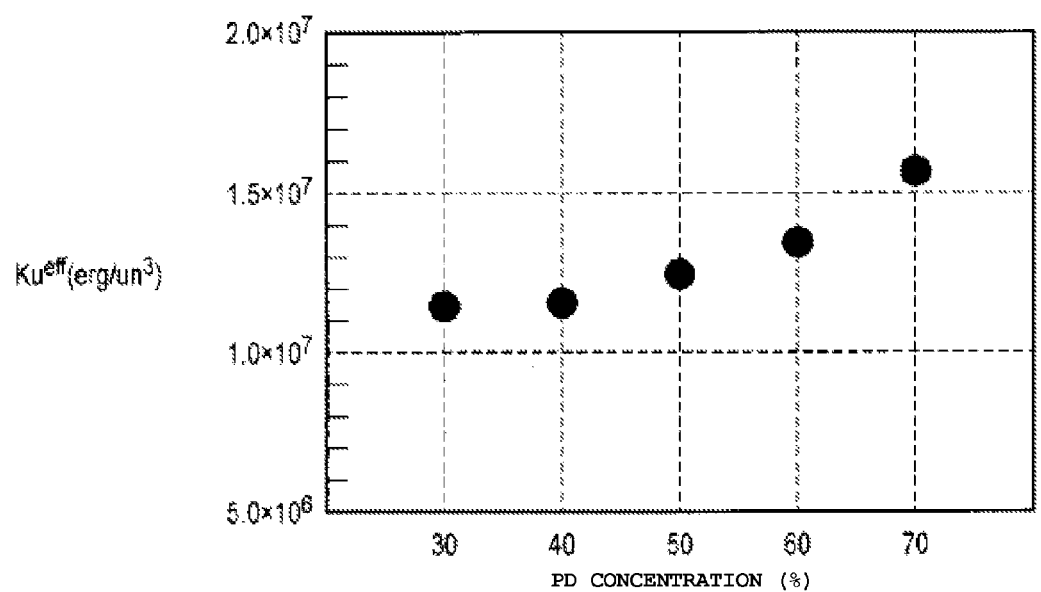
FIG. 5 is a diagram illustrating the dependence of the vertical magnetic anisotropy in the memory layer on Pd concentration.

On the other hand, the critical current IC needed for magnetization inversion caused by spin injection write in the vertical magnetization system is usually proportional to $\alpha/(\eta \cdot \Delta)$ where, α: magnetic relaxation constant η: spin injection efficiency coefficient (2) Material of the Memory Layer As explained above, the memory layer 3 is a vertical magnetization film. In addition, in order to realize both a high resistance to thermal disturbance and a low-current magnetization inversion, it is preferred that the material have a small saturated magnetization MS, a vertical magnetic anisotropy Ku high enough to maintain the thermal disturbance index Δ, and a high polarization rate. The memory layer 3 is made of an alloy containing cobalt (Co), palladium (Pd), and platinum (Pt), or an alloy prepared by adding 0 to 30 at % of boron (B) in one or more elements among Co, iron (Fe), and nickel (Ni), or their laminated structure. For the base layer 5 shown in FIG. 1 to FIG. 4, by appropriately selecting the orientation of the atomically closed packed surface of the base layer, it is possible to control the crystal orientation property of the memory layer 3, and the memory layer 3 is useful as a vertical magnetization film. FIG. 5 is a diagram illustrating the dependence of the effective vertical magnetic anisotropy Kueff on the concentration of Pd in the CoPd film adopted as the memory layer 3 on the concentration of Pd. Here, the abscissa represents the Pd concentration, and the ordinate represents the effective vertical magnetic anisotropy Kueff.

As can be seen from FIG. 5, when the Pd concentration is 30 at % or higher, it is possible to realize a vertical magnetic anisotropy as high as $1\times10^7$ (erg/cm$^3$) or higher. By such high vertical magnetic anisotropy, it is possible to provide a magnetoresistive element with a high thermal stability even when formed with small feature sizes. Also, the memory layer 3 may contain the following additive elements: Fe, Ni, B, vanadium (V), aluminum (Al), chromium (Cr), etc. The memory layer 3 may also have the laminated structure of the magnetic film 3a and the interface magnetic film 3b in contact with the nonmagnetic layer 4 as in the second and the fourth embodiments. For heat resistance, the interface magnetic film 3b is made of a material containing at least one element among Co, Fe, and Ni, or an alloy prepared by adding 0 to 30 at % at least one element of B, Al, and Si into the aforementioned material, or the multilayer structure.

When an oxide with a sodium chloride type structure is adopted as the nonmagnetic layer 4, the NaCl crystal structure oxide includes crystal grown on:

(i) an alloy containing one or more of Fe, Co, and Ni, such as an amorphous CoFeNiB alloy, or (ii) an alloy with a body-centered cubic (BCC) structure with preferred orientation of (100) plane and containing one or several of Fe, Co, Ni.

As a result, growth can take place easily with the (100) plane as the preferred orienting plane. Especially, on the amorphous alloy of CoFeX (X represents at least one element of B, C and N) added with B, C, N, it is very easy to have the (100) plane as the preferred orientation. For this purpose, it is preferred that the magnetic material layer in contact with the nonmagnetic layer 4 be an alloy containing Co, Fe and B, that is, $(CoFe)_{100-y}B_y$ ($0 \leq y \leq 30$ at %).

The interface magnetic film 3b may also have a structure of laminated magnetic and nonmagnetic material layers. The nonmagnetic material layer is preferably made of any element of Ta, W, Hf, Zr, Nb, Mo, Ti, V, Cr or their alloy. When Ta is adopted as the nonmagnetic material layer and CoFeB is adopted as the magnetic material layer, the B of the CoFeB of the magnetic material layer is attracted to Ta, so that there is a distribution with higher concentration of B near the Ta layer.

The interface magnetic film 3b is formed by repeatedly laminating the magnetic material layer and the nonmagnetic material layer to form one or several series of layers. Here, it is preferred that the magnetic material layers have magnetic exchange bonding via the nonmagnetic material layer. It is preferred that the nonmagnetic material layer be 10 Å or thinner, or more preferably 5 Å or thinner. As a result, the interface magnetic film 3b will have its magnetization direction aligned with that of the magnetic film 3a.

[2] Fixed Layer

In the following, the fixed layer 2 in the first through the fourth embodiments will be explained. It is preferred that the fixed layer 2 be made of a material that does not have its magnetization direction changed easily and that a multilayer film structure be adopted with respect to the memory layer 3. That is, it is preferred that the material or a multilayer film structure have a large effective vertical magnetic anisotropy Kueff and a high saturated magnetization Ms, as well as a large magnetic relaxation constant α.

The fixed layer 2 in the first and the second embodiments has a structure including the following layers laminated sequentially from the side in contact with the nonmagnetic layer 4: the first magnetic material film 2a, the nonmagnetic material film 2b, the second magnetic material film 2c, and the third magnetic material film 2d. In the following, the various layers will be explained.

(1) First Magnetic Material Film 2a

The first magnetic material film 2a is made of a material containing at least one element of Co, Fe and Ni, or an alloy prepared by adding 0 to 30 at % of at least one element of B, Al, and Si to these elements, or a multilayer structure thereof.

(2) Nonmagnetic Material Film 2b

The nonmagnetic material film 2b is made of a material containing at least one element selected from Ta, Zr, Nb, Mo, Ru, Ti, V, Cr, W, Hf, Pt, Pd, Rh, Ir.

(3) Second Magnetic Material Film 2c

The second magnetic material film 2c may also contain the additive elements of Fe, Ni, B, Al, Si, Ta, Zr, Nb, Mo, Ru, Ti, V, Cr, Hf. As will be explained later, in order to cancel the magnetostatic stray field generated in the memory layer and from the fixed layer by the magnetostatic stray field of the bias layer, it is preferred that for the fixed layer, the product of the magnetization×film thickness (Ms 2×t2) be as small as possible. The second magnetic material film 2c of the fixed layer is a material mainly made of $Co_{100-x}W_x$ (0<x<40 at %).

Figure 6:
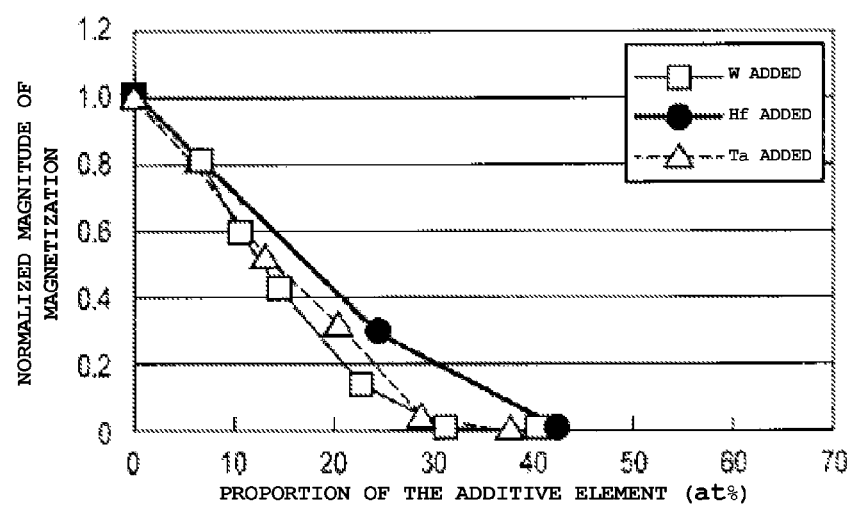
FIG. 6 is a diagram illustrating the dependence of the magnitude of the magnetization of the CoW, CoHf and CoTa on the composition of the additive elements.

FIG. 6 shows the dependence of the normalized magnitude of magnetization of $Co_{100-x}W_x$ on the W content, the dependence of the normalized magnitude of magnetization of $Co_{100-y}Hf_y$ on the Hf content, and the dependence of the normalized magnitude of magnetization of $Co_{100-z}Ta_z$ on the Ta content. The magnitude of the magnification of the $Co_{100-x}W_x$ decreases almost monotonically as the W content increases. The magnitudes of the magnetizations of the $Co_{100-y}Hf_y$ and $Co_{100-z}Ta_z$ decrease almost monotonically as the Hf content and the Ta content increase, respectively.

Figure 7:
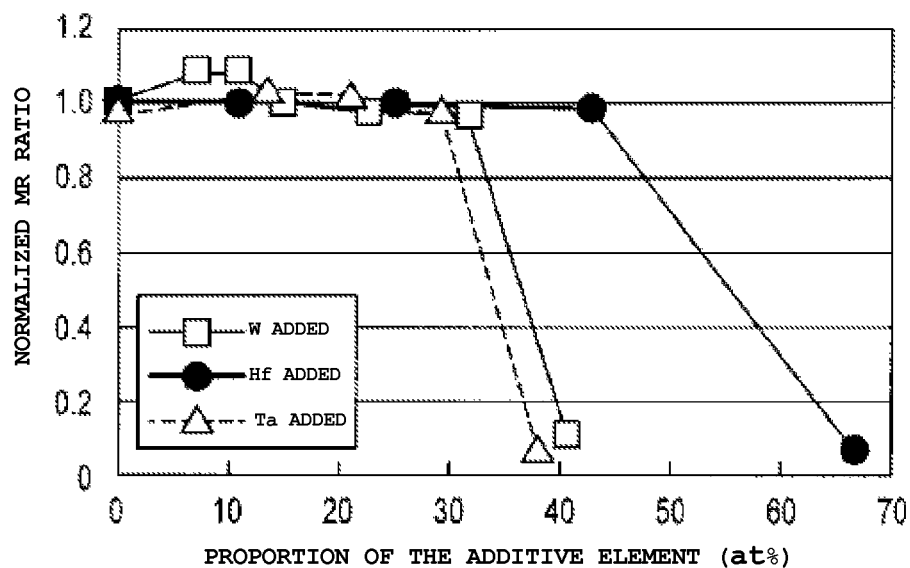
FIG. 7 is a diagram illustrating the dependence of the ratio of MR to CoW, CoHf and CoTa on the composition of the additive elements.

FIG. 7 shows the dependence of the normalized MR ratio of the $Co_{100-x}W_x$ on the W content, the dependence of the normalized MR ratio of $Co_{100-y}Hf_y$ on the Hf content, and the dependence of the normalized MR ratio of $Co_{100-z}Ta_z$ on the Ta content. The MR ratio of $Co_{100-x}W_x$ decreases drastically with a W content of about 30 at % as the boundary of change. The MR ratio of $Co_{100-z}Ta_z$ decreases drastically with a Ta content of about 30 at % as the boundary of change. The MR ratio of the $Co_{100-y}Hf_y$ decreases drastically with a Hf content of about 45 at % as the boundary of change.

In consideration of the dependence of the MR ratio on the composition of the additive elements and the necessary MR ratio, the $Co_{100-x}W_x$ should be in the range of 0<x<40 at %, or preferably in the range of 10<x<30; the $Co_{100-y}Hf_y$ should be in the range of 0<y<60, or preferably in the range of 20<x<50, and the $Co_{100-z}Ta_z$ should be in the range of 0<z<40, or preferably in the range of 10<z<30.

That is, as a result of extensive studies by the present inventors, by using CoW, CoHf or CoTa with a prescribed composition of additive elements as the material for the second magnetic material film 2c, it is possible to significantly decrease the magnitude of the magnetization×film thickness of the fixed layer without degrading the MR ratio. As a result, the magnetostatic stray field generated in the memory layer can be cancelled, and it is possible to realize the magnetoresistive element of the spin injection write system that can decrease the switching current value and its dispersion.

When material with a saturated magnetization similar to that of the reference layer is adopted in the shift adjusting layer, the film thickness of the shift adjusting layer should be designed thicker than the film thickness of the reference layer. In this embodiment, it is possible to significantly decrease the product of the magnetization×film thickness of the fixed layer without degrading the MR ratio. Consequently, it is possible to minimize the film thickness of the shift adjusting layer 22. For example, when the thickness of the well-known magnetic material film is 36 nm, the thickness of the shift adjusting layer 22 in this embodiment is 18 nm, that is, half the thickness of the second magnetic material film. As a result, even when material having saturated magnetization similar to that of the reference layer is adopted in making the shift adjusting layer, it is still not difficult to carry out the element processing.

When CoW alloy is adopted in making the second magnetic material film 2c, it is possible to identify the W content distribution and the film thickness by analysis using the electron energy loss spectroscopic method of a transmissive electron microscope (TEM-EELS), or the secondary ion mass spectroscopic method (SIMS). In addition, it is possible to identify these parameters of the magnetoresistive element using the energy dispersion type X-ray spectroscopic method (TEM-EDX).

When the principal component of the second magnetic material film 2c of the fixed layer is $Co_{100-y}Hf_y$ (0<y<60 at %), or $Co_{100-z}Ta_z$ (0<z<40 at %), the same results as those of the $Co_{100-x}W_x$ (0<x<40 at %) are obtained. The x is in the range of 10<x<30 at %, the y is in the range of 20<y<50 at %, and the z is in the range of 10<z<30 at %. Also, the same results can be realized by using Fe or Ni instead of Co.

In addition, the same results can be realized by using a compound of Co and Nb, a compound of Co and Mo, a compound of Co and Ru, a compound of Co and Rh, a compound of Co and Os, or a compound of Co and Ir instead of the compounds. In addition, the same results can be obtained by using Fe or Ni instead of Co.

(4) Third Magnetic Material Film 2d

The following materials may be adopted in making the third magnetic material film 2d.

(a) Man-Made Lattice System

The man-made lattice system has a structure in which layers of an alloy containing at least one element of Fe, Co and Ni (magnetic layer) and layers of at least one element of Cr, Pt, Pd, Ag, Ir, Rh, Ru, Os, Re, Au and Cu (nonmagnetic layer) are alternately laminated.

Examples include Co/Pt man-made lattice, Co/Pd man-made lattice, CoCr/Pt man-made lattice, Co/Ru man-made lattice, Co/Os, Co/Au, Ni/Cu man-made lattice, etc. Examples of the man-made lattice system structures using two magnetic layers include Co/Ni man-made lattice and Fe/Ni man-made lattice. For these man-made lattices, by adding elements into the magnetic layer and adjusting the film thickness ratio of the magnetic layer and the nonmagnetic layer during lamination, it is possible to adjust the effective magnetic anisotropy and the saturated magnetization.

(b) Ordered Alloy System

The ordered alloy system refers to an alloy containing one or several elements of Fe, Co, and Ni and one or several elements of Pt and Pd. The crystal structure of the alloy is an L10 type coded alloy. Examples of L10 type coded alloys include Fe50Pt50, Fe50Pd50, Co50Pt50, Fe30Ni20Pt50, Co30Fe20Pt50, Co30Ni20Pt50, etc. The coded alloys are not limited to these compositions.

By adding insulating substances as well as Cu, Cr, Ag, B and other impurity elements or their alloys into the ordered alloys, it is possible to adjust the effective magnetic anisotropy and the saturated magnetization.

(c) Disordered Alloy System

The disordered alloy system refers to a metal containing Co as its principal component and also containing one or several elements of Cr, Ta, Nb, V, W, Hf, Ti, Zr, Pt, Pd, B, Fe, Ni.

Examples include CoCr alloy, CoPt alloy, CoCrPt alloy, CoCrPtTa alloy, CoCrNb alloy, etc. For these alloys, by changing the proportions of the nonmagnetic elements, it is possible to adjust the effective magnetic anisotropy and the saturated magnetization.

(d) RE (Rare Earth Metal)-TM (Transitional Metal) Alloy System

Depending on the rare earth metal material, the alloys of the rare earth metals and transitional metals may be formed as either ferromagnetic material or ferromagnetic material.

Examples of ferromagnetic materials include the alloys containing terbium (Tb), dysprosium (Dy) or gadolinium (Gd) and at least one element among Fe, Co and Ni. The ferromagnetic materials include, e.g., TbFe, TbCo, TbFeCo, DyTbFeCo, GdTbCo, etc.

Examples of ferromagnetic materials include the alloys containing samarium (Sm), neodymium (Nd), holmium (Ho) and at least one element among the Fe, Co, and Ni. The ferromagnetic materials include SmCo5, NdFeB, etc. For these alloys, it is possible to adjust the magnetic anisotropy and the saturated magnetization by adjusting the composition.

[3] Bias Layer

As shown in FIG. 1 to FIG. 4, the nonmagnetic layer 21 and the bias layer (shift adjusting layer) 22 are arranged between the fixed layer 2 and the cap layer 6. As a result, it is possible to relax and adjust shift of the inverted current of the memory layer 3 by the magnetostatic stray field of the fixed layer 2.

It is desirable that the nonmagnetic layer 21 have a high heat resistance so that the fixed layer 2 and the bias layer 22 do not interdiffuse in the heat treatment operation, and thus they function to control the crystal orientation when the bias layer 22 is formed. In addition, when the nonmagnetic layer 21 is made thicker, the distance between the bias layer 22 and the memory layer 3 becomes larger so that the shift adjusting magnetic field applied from the bias layer 22 on the memory layer 3 decreases. As a result, the film thickness of the nonmagnetic layer 21 is preferably 5 nm or thinner.

The bias layer 22 has a simple axis of magnetization perpendicular to the film surface and is made of a ferromagnetic material. More specifically, it is made of the materials described herein for making the fixed layer 2. Here, as the bias layer 22 is farther from the memory layer 3 than the fixed layer 2, in order to adjust the magnetostatic stray field applied on the memory layer 3 by the bias layer 22, it is necessary to select the film thickness of the bias layer 22 or the magnitude of the saturated magnetization Ms larger than the fixed layer 2.

That is, suppose the film thickness and the saturated magnetization of the fixed layer 2 are t2 and MS2, respectively, and the film thickness and the saturated magnetization of the bias layer 22 are t22 and MS22, respectively, the following relationship (2) should be met.

$$MS2 \times t2 < MS22 \times t22 \tag{2}$$

For example, assume that the element size is 50 nm wide in order to cancel the shift in the inverted current, while the fixed layer 2 is made of a magnetic material with the saturated magnetization Ms of 1,000 emu/cm3 and a film thickness of 5 nm, it is necessary that the film thickness of the nonmagnetic layer 21 is 3 nm, and the bias layer 22 has bias layer characteristics including a saturated magnetization Ms of 1,000 emu/cm3 and a film thickness about 15 nm.

In addition, in order to realize the effect of cancellation of the shift of the inverted current, it is necessary to set the magnetization directions of the fixed layer 2 and the bias layer 22 anti-parallel (opposed) to each other. In order to meet this relationship, materials should be selected appropriately to ensure that for the coercive force Hc2 of the fixed layer 2 and the coercive force Hc22 of the bias layer 22, the relationship of Hc2>Hc22 is met, or the relationship of Hc2<Hc22, is met. In this case, by magnetizing the minor loop beforehand to invert the magnetization direction of the layer with a smaller coercive force, it is possible to set the magnetization directions of the fixed layer 2 and the bias layer 22 anti-parallel each other.

Also, by making synthetic anti-ferromagnetic bonding (SAF) between the fixed layer 2 and the bias layer 22 via the nonmagnetic layer 21, it is also possible to set the magnetization directions of the fixed layer 2 and the bias layer 22 anti-parallel to each other.

More specifically, for example, when ruthenium (Ru) is used as the material of the nonmagnetic layer 21, it is possible to make an anti-parallel bonding for the magnetization directions between the fixed layer 2 and the bias layer 22. As a result, it is possible to decrease the shift of the inverted current of the memory layer 3. Consequently, it is possible to reduce the dispersion in the inverted current of the memory layer 3 between the elements.

In the above, explanation has been made in the case when the nonmagnetic layer 21 and the bias layer 22 are arranged between the fixed layer 2 and the cap layer 6. However, one may also adopt a scheme in which the nonmagnetic layer 21 and the bias layer 22 (shift adjusting layer) are arranged between the memory layer 3 and the base layer 5. In this case, too, it is possible to relax and adjust the shift in the inverted current of the memory layer 3 by the magnetostatic stray field of the fixed layer 2. In addition, one may also adopt a scheme in which the nonmagnetic layer and the bias layer (shift adjusting layer) are arranged both between the fixed layer 2 and the cap layer 6, and between the memory layer 3 and the base layer 5.

[4] Base Layer

As explained above for the memory layer, in order to form vertical magnetic film having a direction perpendicular to the film surface as the simple axis of magnetization, it is necessary to adopt a structure that allows easy orientation of the atomically closed packed surface. That is, it is necessary to control the crystal orientation property of the (111) plane of the face-center cubic (FCC) structure and the (001) plane of the hexagonal close packed (HCP) structure. Consequently, it is important to select the material of the base layer and the laminated constitution for this purpose.

(1) Laminated Constitution of the Base Layer

Figure 8:
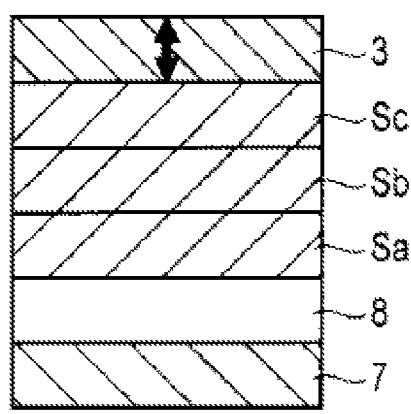
FIG. 8 is a cross-sectional view illustrating the laminated structure containing the magnetoresistive element, the base layer and the memory layer.

FIG. 8 is a cross-sectional view illustrating the laminated structure containing the base layer 5 and the memory layer 3 in the magnetoresistive element in the embodiment.

The laminated structure is a structure where a Ta film with a film thickness of about 5 nm is arranged as a close contact layer 8 between a lower electrode 7 and the base layer 5. Here, the base layer 5 has a laminated structure where base films 5a, 5b, 5c are laminated in this order. Also, on the base layer 5, as with the memory layer 3, for example, a CoPd layer with film thickness of about 2 nm is arranged. The structure of the portion above the memory layer 3 is as that shown in FIG. 1 to FIG. 4.

In the magnetoresistive elements in the first through the fourth embodiments, it is preferable that the base film 5c contained in the base layer 5 be made of a metal material having a lattice structure matching the memory layer 3. It is preferred that the base film 5a be made of a material and have a structure so that the base films 5b, 5c are smooth and can improve the crystal orientation property. It is preferred that the base films 5b, 5c be made of a Ru layer with a film thickness of about 3 nm and a Pt layer with a film thickness of about 3 nm, respectively.

(2) Material of the Base Layer

In the following, the specific materials for making the base films 5a, 5b and 5c that form the base layer 5 will be explained.

A metal with a closed packed structure is adopted as the base film 5c. The memory layer 3 is made of a metal with a lattice matched to, e.g., the CoPd alloy, or the CoPt alloy and having a closed packed structure, such as Pt, Pd, Ir, Ru or the like. Also, the metal may be an alloy instead of a single element, such as Pt—Pd, Pt—Ir, including two elements or three or more elements. Other examples include the alloys formed from a metal having the fcc crystal structure, such as Cu, Au, Al, and other fcc metals, such as Pt—Cu, Pd—Cu, Ir—Cu, Pt—Au, Ru—Au, Pt—Al, Ir—Al, as well as the alloys formed with Re, Ti, Zr, Hf, and other hcp metals, such as Pt—Re, Pt—Ti, Ru—Re, Ru—Ti, Ru—Zr, Ru—Hf, etc.

If the base layer 5 is too thick, the smoothness is poor so that the film thickness should be 30 nm or thinner. The laminated structure of the base films 5b and 5c is for adjusting the lattice constant before formation of the CoPd alloy or CoPt alloy. For example, when the base film 5b is formed from Ru and the base film 5c is made of Pt, the structure of the Pt base film 5c is influenced by the Ru of the base film 5b, so that its lattice constant becomes modified from its bulk lattice constant in pure form. However, as explained above, the lattice constant can be adjusted by using an alloy, too, so that it is possible to omit one of the base films 5b, 5c.

In the base layer 5, base film 5a is adopted for improving the smoothness and the crystal orientation property of the metal having the closed packed structure of the base films 5b and 5c. More specifically, Ta or the like is adopted for the base film 5a. In addition, if the base film 5a is too thick, it takes a long time to form, decreasing manufacturing productivity. On the other hand, if it is too thin, the orientation effect is lost. Consequently, the film thickness of the base film 5a is preferably in the range of 1 nm to 10 nm.

[5] Nonmagnetic Layer

An oxide having an NaCl crystal structure is a preferred material for making the nonmagnetic layer 4 in the first through the fourth embodiments. Examples include MgO, CaO, SrO, TiO, VO, NbO, etc. For these oxides having a NaCl crystal structure, when they are grown as crystal on the following alloys, it is easy for the (100) plane to grow as the preferred oriented plane.

(i) An alloy containing one or two of Fe, Co and Ni as the principal ingredient, such as amorphous CoFeNiB alloy.

(ii) An alloy containing one or two types of FeCoNi having the (100) preferred oriented plane in the body-centered cubic (BCC) structure.

In particular, with the amorphous alloy of CoFeX (X represents at least one of B, C, and N) added with B, C, N, etc., it is very easy to make the preferred orientation for the (100) plane.

Also, when the magnetization direction of the memory layer 3 and the magnetization direction of the fixed layer 2 are anti-parallel (opposed) to each other, the spin polarized Δ1 band becomes the means for the tunnel conduction. Consequently, only the majority spin electrons contribute to conduction. As a result, the conductivity decreases and the resistance increases for the magnetoresistive element.

On the contrary, when the magnetization direction of the memory layer 3 and the magnetization direction of the fixed layer 2 are parallel with each other, the Δ5 band without spin polarization dominates the conduction, so that the conductivity rises and the resistance decreases for the magnetoresistive element. Consequently, formation of the Δ1 band becomes the key point in developing the high MR ratio. In order to form the Δ1 band, it is necessary to have a good matching property between the (100) plane of the nonmagnetic layer 4 made of the oxide of the NaCl crystal structure and the interface between the memory layer 3 and fixed layer 2.

In order to further improve the lattice matching property of the (100) plane of the nonmagnetic layer 4 made of an oxide layer with NaCl structure, it is preferred that the memory layer and the fixed layer have a laminated structure. In order to form the Δ1 band, for the interface magnetic film 3b that forms the memory layer 3 and the interface magnetic film 2a that forms the fixed layer 2, it is preferred that the material be selected to have a lattice mismatch with the (100) plane of the nonmagnetic layer 4 of 5% or smaller.

As explained above, according to the first through the fourth embodiments, the second magnetic material film 2c contained in the fixed layer 2 is made of Co1-xWx (0<x<40 at %), it is possible to cancel out the magnetostatic stray field of the fixed layer generated in the memory layer by the magnetostatic stray field of the bias layer. That is, it is possible to obtain a magnetoresistive element of the spin injection write system that can decrease thee inverted current value and its range.

Fifth Embodiment

In the following, the magnetic random access memory (MRAM) according to the fifth embodiment will be explained with reference to FIG. 9 and FIG. 10. The MRAM of the fifth embodiment has a structure that uses the magnetoresistive element in any of the first through the fourth embodiments. In the present embodiment, the magnetoresistive element 1 of the first embodiment is adopted as the magnetoresistive element.

Figure 9:
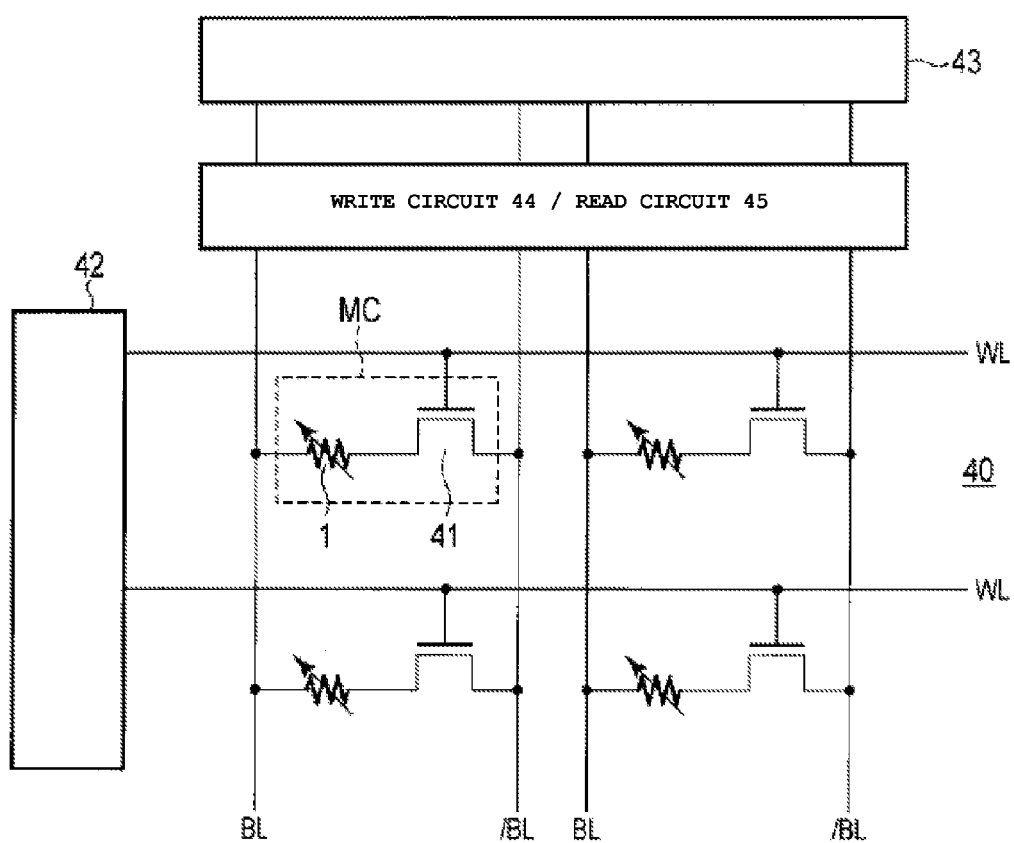
FIG. 9 is a circuit diagram illustrating the constitution of the MRAM according to a seventh embodiment.
Figure 10:
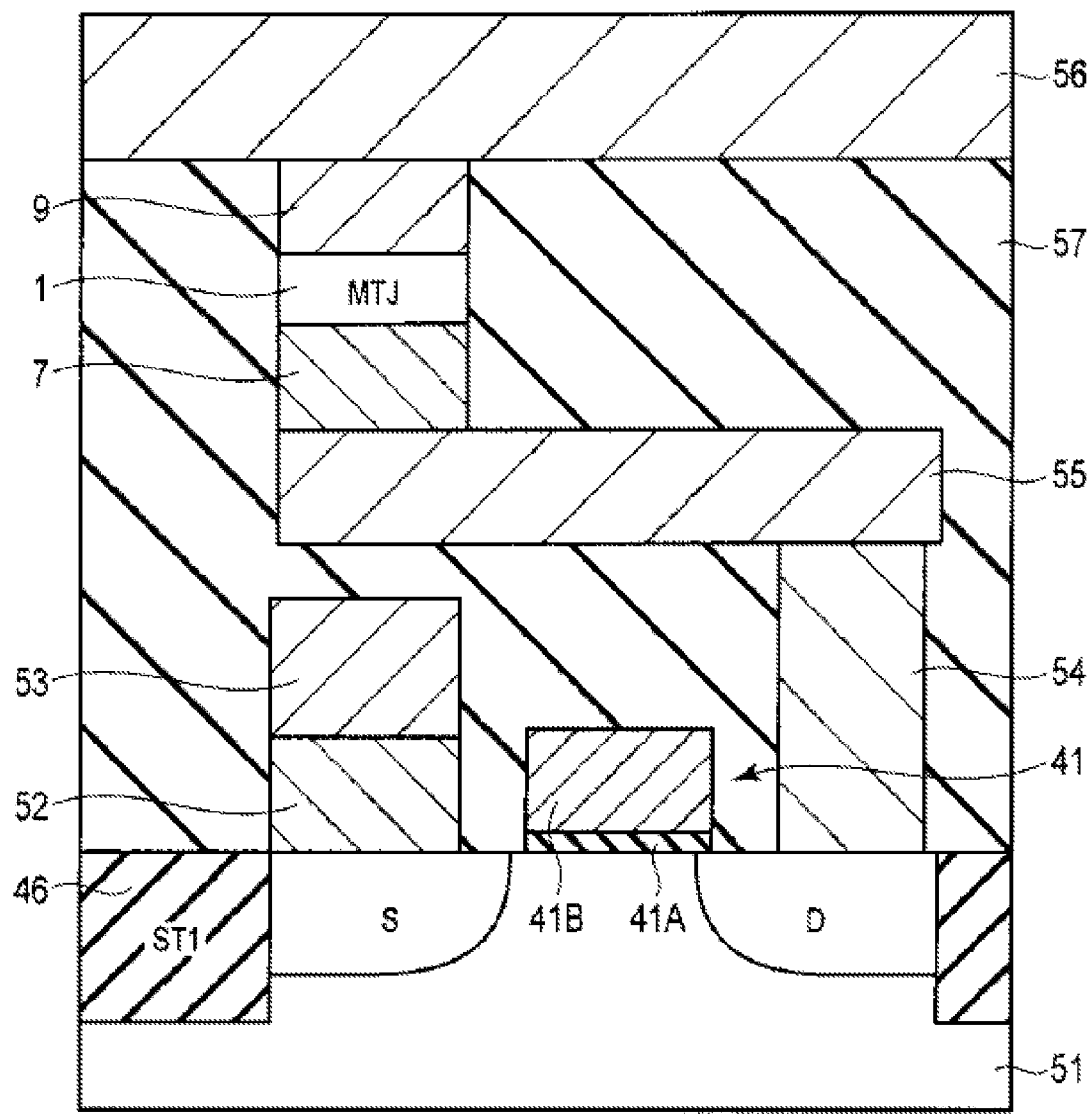
FIG. 10 is a cross-sectional view illustrating the memory cell in the MRAM according to the seventh embodiment.

FIG. 9 is a circuit diagram illustrating the constitution of the MRAM according to the fifth embodiment.

The MRAM of the fifth embodiment has a memory cell array having plural memory cells MC arranged in a matrix configuration. In the memory cell array 40, plural bit line pairs BL and /BL are arranged to extend in the column direction (columns). Also, in the memory cell array 40, plural word lines WL are arranged to extend in the row direction (rows).

The memory cells MC are arranged at the cross points between the bit lines BL and the word lines WL. Each of the memory cells MC has a magnetoresistive element 1 and a selection transistor 41 (such as n-channel MOS transistor). One end of the magnetoresistive element 1 is connected to the bit line BL. The other end of the magnetoresistive element 1 is connected to the drain terminal of the selection transistor 41. The source terminal of the selection transistor 41 is connected to the bit line /BL. In addition, the gate terminal of the selection transistor 41 is connected to the word line WL.

A row decoder 42 is connected to the word line WL. A write circuit 44 and a read circuit 45 are connected to the bit line pair BL and /BL. A column decoder 43 is connected to the write circuit 44 and the read circuit 45. Then, each memory cell MC is selected by the row decoder 42 and the column decoder 43.

Data write to the memory cell MC is carried out as follows. First of all, in order to carry out data write to the selected memory cell MC, the word line WL connected to this memory cell MC is activated. As a result, the selection transistor 41 is turned on.

Here, corresponding to the write data, a bidirectional write current Iw is fed to the magnetoresistive element 1. More specifically, when the write current Iw is fed from the left to the right in the magnetoresistive element 1, the write circuit 44 has a positive voltage applied on the bit line BL, and the ground voltage is applied on the bit line /BL. When the write current Iw is fed from right to left in the magnetoresistive element 1, the write circuit 44 applies a positive voltage on the bit line /BL, and the ground voltage is applied on the bit line BL. In this way, data "0" or data "1" can be written in the memory cell MC.

Then, data read from the memory cell MC is carried out as follows. First of all, the selection transistor 41 of the memory cell MC is turned on. Then read circuit 45 feeds read current Ir from right to left in the magnetoresistive element 1. Then, read current Ir is fed from the bit line /BL to the bit line BL. The read circuit 45 detects the resistance of the magnetoresistive element 1 on the base of the read current Ir. In addition, the read circuit 45 reads the data stored in the magnetoresistive element 1 from the detected resistance.

In the following, the structure of MRAM will be explained with reference to FIG. 10. FIG. 10 is a cross-sectional view illustrating the structure of one memory cell MC.

As shown in the figure, the MRAM includes the magnetoresistive element 1 (MTJ) and the selection transistor 41. An element-isolating insulating layer 46 is formed on the surface area of a p-type semiconductor substrate 51. The surface area of the semiconductor substrate 51 free of the element-isolating insulating layer 46 becomes the active area where the elements are formed. For example, the element-isolating insulating layer 46 is made of Shallow Trench Isolation (STI). Silicon oxide may be adopted as the STI, for example.

In the active area of the semiconductor substrate 51, the source region S and the drain region D are formed separated from each other. The source region S and the drain region D are made of n+ type diffusion regions formed by feeding a high concentration impurity, such as an n+ type impurity into the semiconductor substrate 51.

The gate insulating film 41A is formed on the semiconductor substrate 51 between the source region S and the drain region D. Gate electrode 41B is formed on this gate insulating film 41A. The gate electrode 41B functions as the word line WL. In this way, the selection transistor 41 is arranged on the semiconductor substrate 51.

On the source region S, a wiring layer 53 is formed via contact plugs 52. The wiring layer 53 works as the bit lines /BL. On the drain region D, lead-out lines 55 are formed via contact plugs 54.

The magnetoresistive element 1 sandwiched between the lower electrode 7 and an upper electrode 9 is arranged on the lead-out line 55. A wiring layer 56 is formed on the upper electrode 9. The wiring layer 56 works as the bit line BL. Also, the portion between the semiconductor substrate 51 and the wiring layer 56 is filled with an interlayer insulating layer 57 made of, e.g., silicon oxide.

As explained in detail above, according to the fifth embodiment, the MRAM can be formed from the magnetoresistive element 1. In addition to the spin injection type magnetic memory, the magnetoresistive element 1 may also be used as the magnetic wall moving type magnetic memory.

The MRAM in the fifth embodiment can be adopted in various devices. In the following, some examples of application of the MRAM will be explained.

[1] Application Example 1

Figure 11:
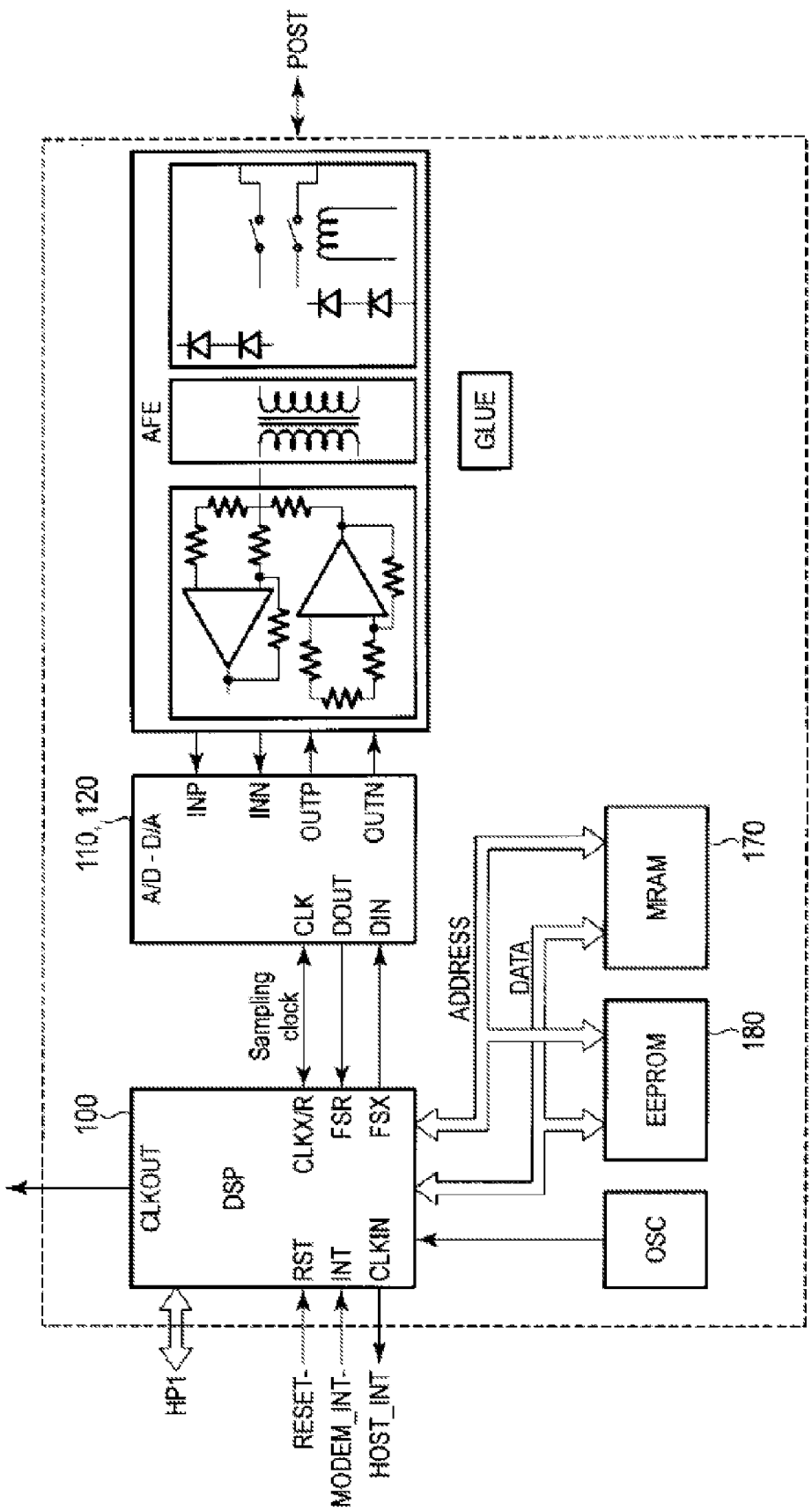
FIG. 11 is a block diagram illustrating the DSL data bus section of the DSL modem as an application example.

FIG. 11 is a diagram illustrating the state when the DSL data bus section of the modem for the Digital Subscriber Line (DSL) is extracted.

This modem has a programmable digital signal processor (DSP: Digital Signal Processor) 100, an A/D converter 110, a D/A converter 120, a transmission driver 130, and a receiver amplifier 140, etc.

In FIG. 11, the band-pass filter is omitted. Instead of the band-pass filter, the MRAM 170 and the EEPROM (electrically-erasable-programmable ROM) 180 of the seventh embodiment are shown as the memory of the various types of options for holding the line code program (the program for selecting and turning on the modem corresponding to the encoded subscriber line information, transmission conditions, etc. (line codes: QAM, CAP, RSK, FM, AM, PAM, DWMT, etc.) executed by the DSP).

In this application example, 2 types of memories, that is, MRAM 170 and EEPROM 180, are adopted for holding the line code program. However, one may also adopt a scheme whereby the EEPROM 180 is replaced by a MRAM. That is, instead of 2 types of memories, only MRAMs are adopted in this constitution.

[2] Application Example 2

Figure 12:
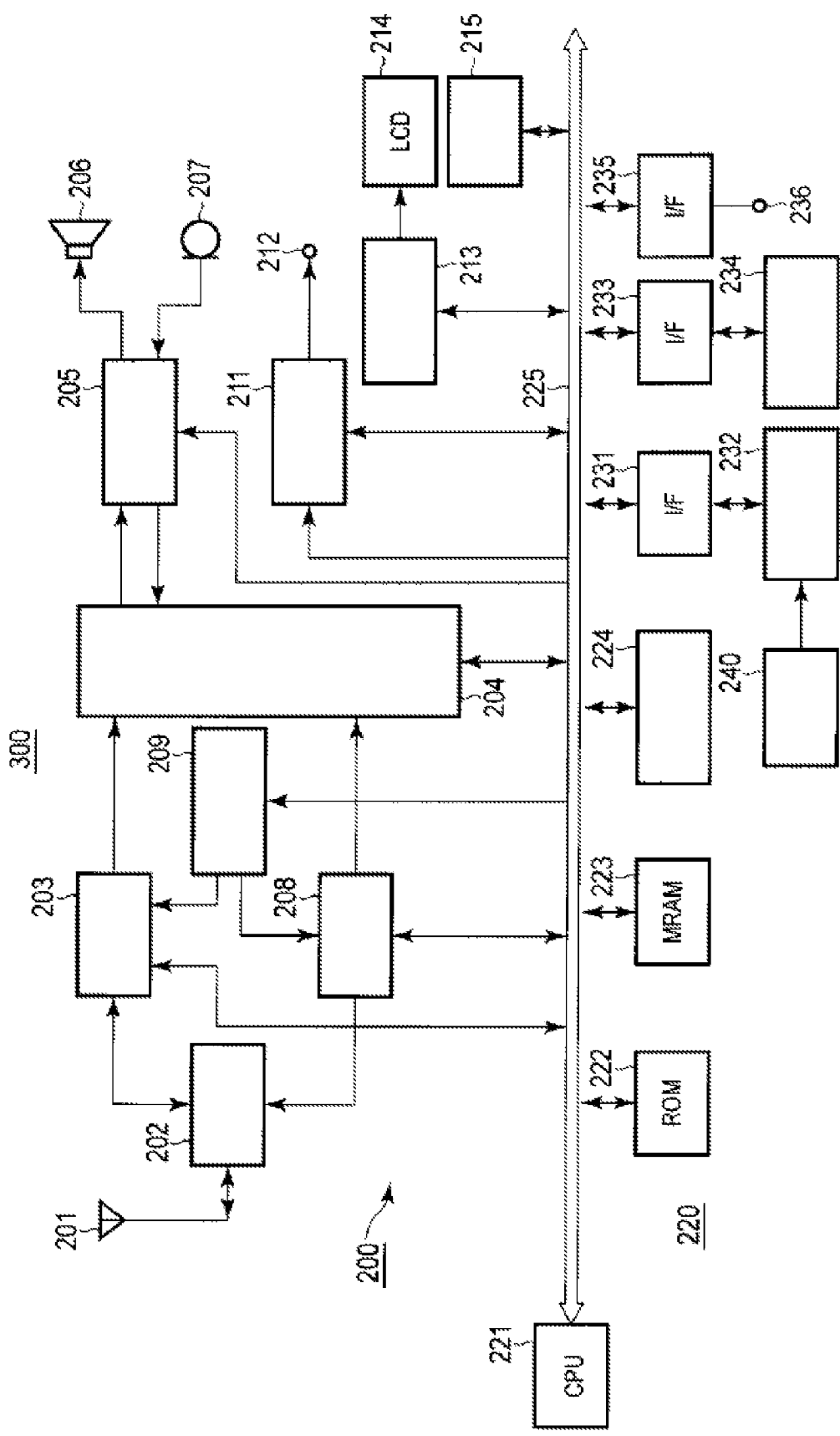
FIG. 12 is a block diagram illustrating the cell phone terminal as an application example.

FIG. 12 is a diagram illustrating another application example in which a cell phone terminal 300 is in use.

The communication section 200 for realizing the communication function includes a transmission/reception antenna 201, an antenna sharing unit 202, a receiving section 203, a base band processing section 204, a Digital Signal Processor (DSP) 205, a speaker (receiver) 206, a microphone (transmitter) 207, a transmission section 208, a frequency synthesizer 209, etc.

In this cell phone terminal 300, there is a control section 220 that controls the various sections of the cell phone terminal 300. The control section 220 is a microcomputer formed for connecting a CPU 221, a ROM 222, an MRAM 223 of the seventh embodiment, and a flash memory 224 via a bus 225.

The program for executing the program in the CPU 221 and the font for display and other data are stored beforehand in the ROM 222.

The MRAM 223 is mainly adopted as an operation region. The CPU 221 stores the data halfway during execution of the program as needed, and it is adopted for temporarily storing the data transmitted between the control section 220 and the various sections.

In addition, the flash memory 224 stores the setting conditions right beforehand, etc. and stores the setting parameters even when power of the cell phone terminal 300 is turned off, so that the application method is set the same when the power is turned on next time. As a result, even when the power supply of the cell phone terminal 300 is off, the stored parameters set there are maintained.

The cell phone terminal 300 also has an audio data reproduction processing section 211, an external output terminal 212, an LCD controller 213, a display liquid crystal display (LCD) 214, and a calling sound generating ringer 215, etc.

The audio data reproduction processing section 211 regenerates the audio data (or the audio information (audio data) stored in an external memory 240 (to be explained later) input to the cell phone terminal 300. The reproduced audio data (audio information) are transmitted via the external output terminal 212 to the headphone or a portable speaker or the like. As a result, the data can be fetched.

In this way, it is possible to reproduce the audio information by setting the audio data reproduction processing section 211. For example, the LCD controller 213 receives the display information from the CPU 221 via the bus 225, converts the information to the LCD control information for controlling the LCD 214, and drives the LCD 214 for display.

The cell phone terminal 300 also has interface circuits (I/F) 231, 233, 235, the external memory 240, an external memory slot 232, a key manipulating section 234, and external input/output terminal 236, etc. A memory card or other external memory 240 is inserted in the external memory slot 232. The external memory slot 232 is connected to the bus 225 via the interface circuit (I/F) 231.

In this way, by setting the external memory slot 232 in the cell phone terminal 300, it is possible to write the internal information of the cell phone terminal 300 to the external memory 240, or to input the information stored in the external memory 240 (such as the audio information) to the cell phone terminal 300.

The key manipulating section 234 is connected to the bus 225 via the interface circuit (I/F) 233. The key input information input from the key manipulating section 234 is sent to, e.g., the CPU 221. The external input/output terminal 236 is connected to the bus 225 via the interface circuit (I/F) 235. The external input/output terminal 236 works as a terminal for input of various types of information from the outside to the cell phone terminal 300 or for output of the information from the cell phone terminal 300 to the outside.

In this application example, the ROM 222, the MRAM 223, and the flash memory 224 are adopted. However, one may also adopt a scheme whereby the flash memory 224 and ROM 222 are replaced by MRAM.

[3] Application Example 3

FIG. 13 to FIG. 17 illustrate examples in which the MRAM is in the form of a smart media card or other card (MRAM card) that accommodates the media contents.

Figure 13:
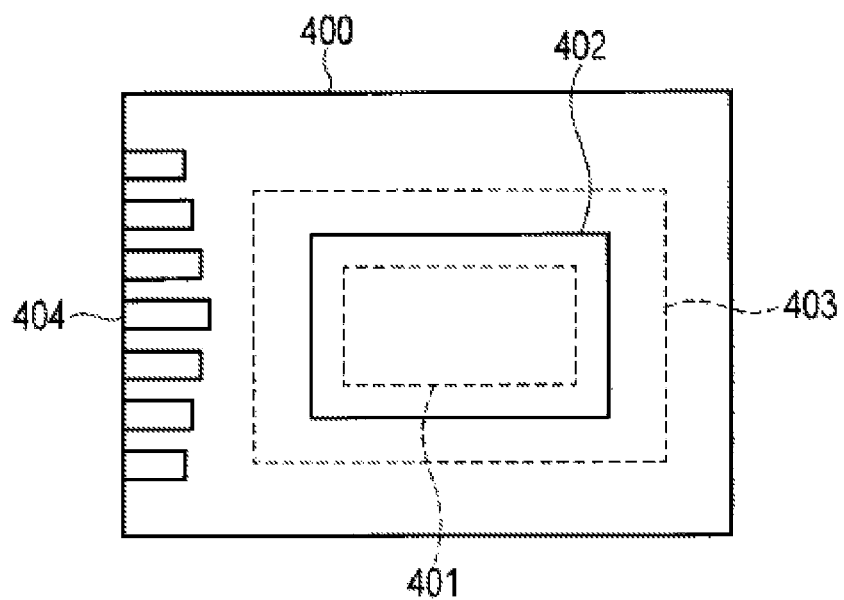
FIG. 13 is a top view of the MRAM card as an application example.

As shown in FIG. 13, the MRAM card main body 400 contains an MRAM chip 401. On this MRAM card main body 400, an opening section 402 is formed at the site corresponding to the MRAM chip 401, and the MRAM chip 401 is exposed. In this opening section 402, a shutter 403 is arranged. When the MRAM card is carried around, the MRAM chip 401 is protected by the shutter 403. This shutter 403 is made of a material, such as a ceramic, that can shield the external magnetic field.

When data transfer is carried out, the shutter 403 is exposed so that the MRAM chip 401 is exposed. The external terminal 404 is for fetching data stored in the MRAM card to the outside.

Figure 14:
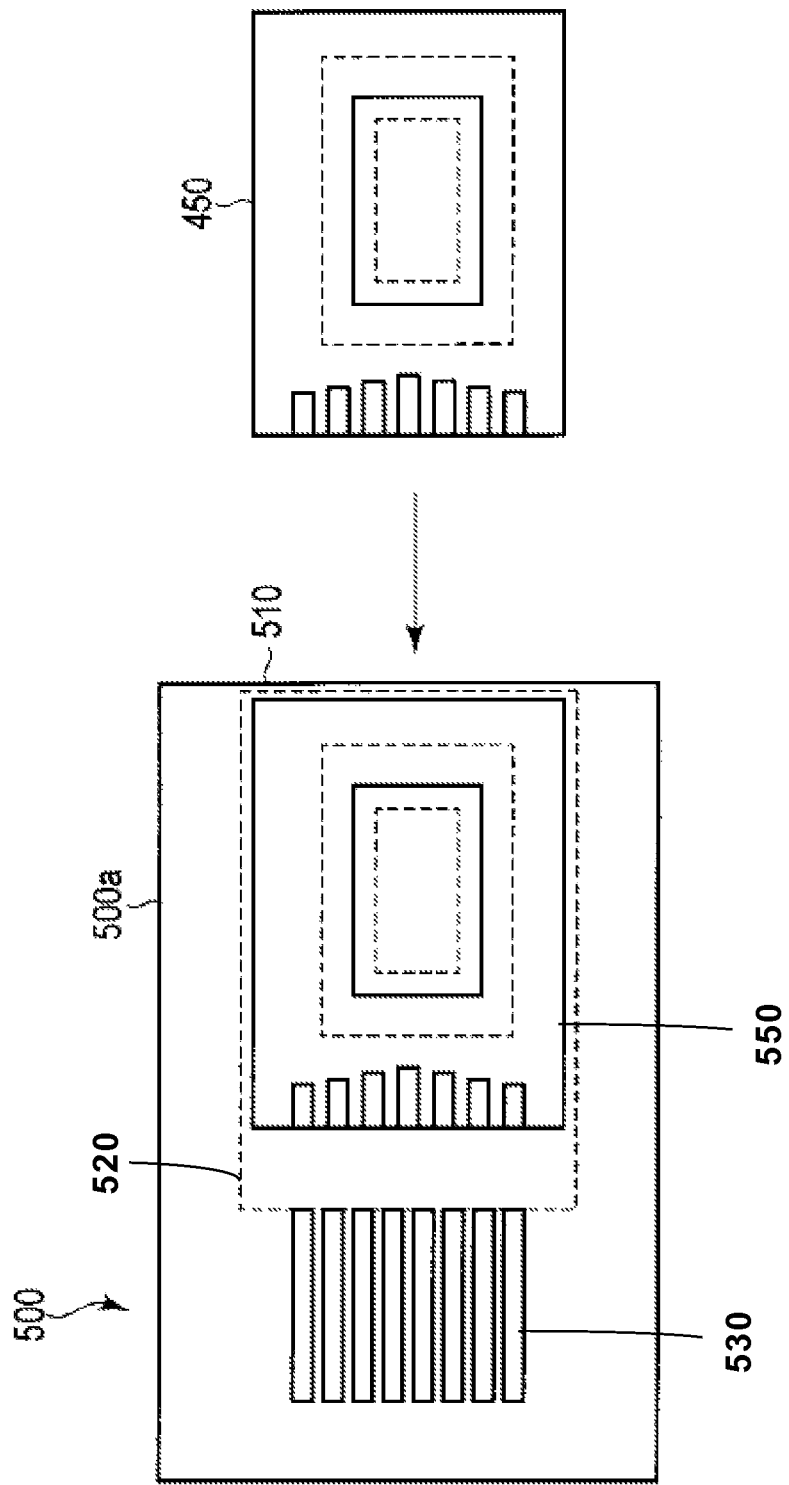
FIG. 14 is a plane view of the card insertion type transfer device as an application example.
Figure 15:
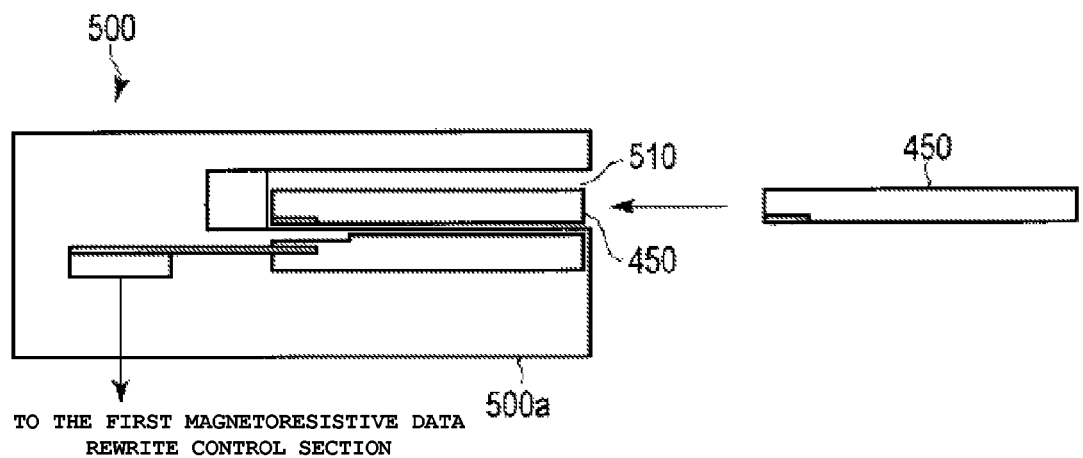
FIG. 15 is a plane view of the card insertion type transfer device as an application example.

FIG. 14 and FIG. 15 illustrate a card insertion type transfer device for transferring data in the MRAM card.

The data transfer device 500 has an accommodating section 500a. A first MRAM card 550 is accommodated in the accommodating section 500a. An external terminal 530 electrically connected to the first MRAM card 550 is arranged in the accommodating section 500a. This external terminal 530 is used to carry out data rewrite for the first MRAM card 550.

A second MRAM card 450 used by the end user is inserted through an inserting section 510 of the data transfer device 500 as indicated by the arrow and pressed in until stopped by a stopper 520. This stopper 520 works as a member for aligning the first MRAM card 550 and the second MRAM card 450. As the second MRAM card 450 is set at the prescribed site, a control signal is fed from the first MRAM data rewrite control section to the external terminal 530, and the data stored in the first MRAM card 550 are transferred to the second MRAM card 450.

Figure 16:
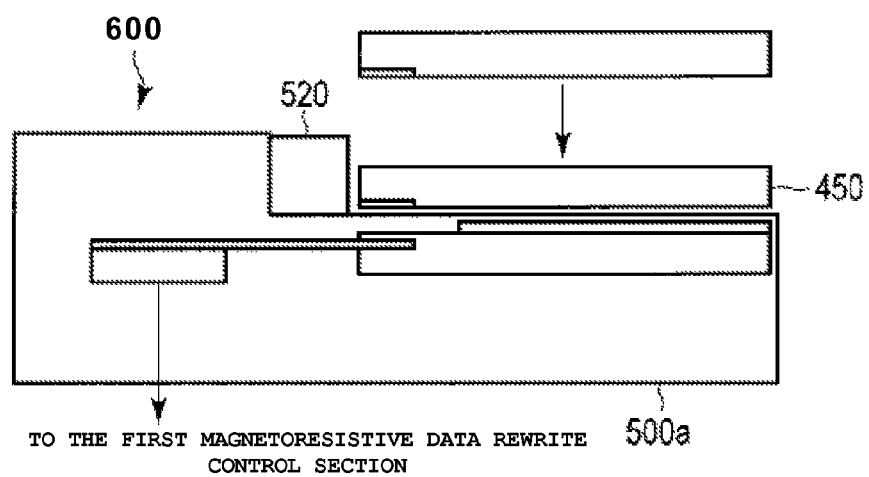
FIG. 16 is a cross-sectional view illustrating the insertion type transfer device as an application example.

FIG. 16 is a cross-sectional view illustrating the inserting type transfer device for transferring data to the MRAM card.

As indicated by arrows, this transfer device 600 is of a type having a second MRAM card 450 inserted and carried on a first MRAM card 550, with the stopper 520 as the target. The transfer method is the same as that of the card inserting type and will not be explained in detail again.

Figure 17:
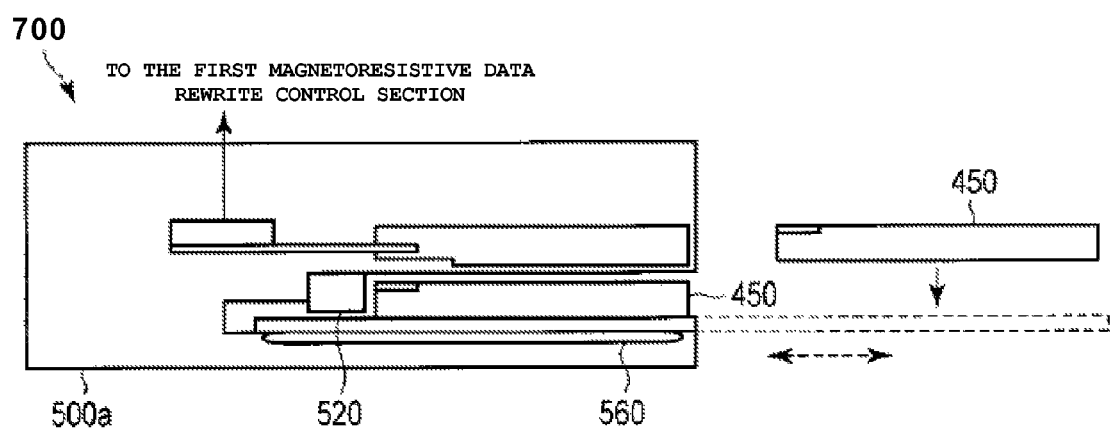
FIG. 17 is a cross-sectional view illustrating the slide type transfer device as an application example.

FIG. 17 is a cross-sectional view illustrating a slide-type transfer device for transferring data to a MRAM card.

Just as the CD-ROM drive or DVD drive, a transfer device 700 has a pan slide 560 arranged in the transfer device 700 which is driven to move as indicated by the arrow. When the pan slide 560 is driven to move to the site indicated by the broken line, the second MRAM card 450 is carried on the pan slide 560. Then, the pan slide 560 is driven to move so that the second MRAM card 450 is transported into the transfer device 700.

This system is identical to the card inserting type with respect to the transfer method and the feature that the tip portion of the second MRAM card 450 is transported to come in contact with the stopper 520 and they will not be explained again.

The MRAM in the fifth embodiment may be any of the following types: a file memory that allows high speed random write, a portable terminal that allows high speed download, a portable player that allows high speed download, a semiconductor memory for broadcasting equipment, a drive record, a home video, a communication high capacity buffer memory, a semiconductor memory for security camera, etc. Consequently, it has a major advantage in industrial applications.

According to the embodiment, as well as a magnetoresistive element of a spin injection write system that can suppress decrease of the magnetic resistance ratio while having a high thermal stability, the present disclosure provides a magnetic memory using the magnetoresistive element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive element comprising;
a first magnetic layer having opposed sides and a thickness, wherein the first magnetic layer has a fixed magnetic direction in a thickness direction thereof and includes cobalt therein;
a second magnetic layer having a thickness, wherein the second magnetic layer has a fixed magnetic direction in a thickness direction thereof and the magnetic direction of the second magnetic layer is opposite to the magnetic direction of the first magnetic layer;
a first non-magnetic layer disposed between the second magnetic layer and a first side of the first magnetic layer;
a variable orientation magnetic layer, disposed on an opposite side of the first magnetic layer from the second magnetic layer; and
a second non-magnetic layer interposed between the first magnetic layer and the variable orientation magnetic layer,
wherein the first magnetic layer comprises a nonmagnetic material film and a second magnetic material film, the second magnetic material film containing $Co_{100-x}W_x$ ($0<x<40$ at %), $Co_{100-y}Hf_y$ ($0<y<60$ at %), or $Co_{100-z}Ta_z$ ($0<z<40$ at %) and in contact with the nonmagnetic material film.

2. The magnetoresistive element of claim 1, wherein a magnetic direction of the variable orientation magnetic layer is switchable between the magnetic direction of the first magnetic layer and the magnetic direction of the second magnetic layer.

3. The magnetoresistive element of claim 2, wherein the second non-magnetic layer is a tunnel barrier layer.

4. The magnetoresistive element of claim 1, wherein the variable orientation magnetic layer comprises Co, Pd and Pt.

5. The magnetoresistive element of claim 1, wherein the first magnetic layer further includes:
a first magnetic material film arranged in contact with the first non-magnetic layer and the nonmagnetic material film.

6. The magnetoresistive element of claim 5, wherein at least one of the first magnetic material film and the variable orientation magnetic layer comprise at least two different magnetic film layers.

7. The magnetoresistive element of claim 6, wherein the first magnetic material film comprises at least two different magnetic film layers and one of the two different magnetic film layers of the first magnetic material film comprises W or an alloy of W.

8. A magnetoresistive element, comprising:
a first magnetic layer having a simple axis of magnetization in a direction perpendicular to a film surface and a magnetization orientation fixed in one direction;
a second magnetic layer having a simple axis of magnetization in a direction perpendicular to the film surface and a changeable magnetization orientation;
a first nonmagnetic layer arranged between the first magnetic layer and the second magnetic layer; and
a third magnetic layer having a simple axis of magnetization in a direction perpendicular to the film surface and a magnetization orientation fixed in the direction opposite the first magnetic layer, wherein the first magnetic layer has a laminated structure including a first magnetic material film arranged in contact with the first nonmagnetic layer, a nonmagnetic material film arranged in contact with the first magnetic material film, and a second magnetic material film containing $Co_{100-x}W_x$ (0<x<40 at %), $Co_{100-y}Hf_y$ (0<y<60 at %), or $Co_{100-z}Ta_z$ (0<z<40 at %) and arranged in contact with the nonmagnetic material film, and wherein, as a current flows, via the first nonmagnetic layer, between the first magnetic layer and the second magnetic layer, the magnetization orientation of the second magnetic layer changes.

9. The magnetoresistive element according to claim 8, wherein:

10<x<30 at %, 20<y<50 at %, 10<z<30 at %.

10. The magnetoresistive element according to claim 8, wherein the first magnetic layer further includes a third magnetic material film arranged in contact with the second magnetic material film.

11. The magnetoresistive element according to claim 8, wherein the third magnetic layer is arranged on a surface of the first magnetic layer on a side opposite to a surface where the first magnetic material film is arranged or on a surface of the second magnetic layer on a side opposite to a surface where the first nonmagnetic layer is arranged.

12. The magnetoresistive element according to claim 8, wherein the second magnetic layer has a 2-layer structure.

13. The magnetoresistive element according to claim 8, wherein a second nonmagnetic layer is arranged between the first magnetic layer and the third magnetic layer.

14. The magnetoresistive element of claim 8, further including:
   a first wiring electrically connected to one end of the magnetoresistive element; and
   a second wiring electrically connected to a second end of the magnetoresistive element.

15. The magnetoresistive element of claim 7, wherein the first magnetic layer further comprises a third magnetic material film disposed between the second magnetic material film and the first non-magnetic layer.

16. The magnetoresistive element of claim 10, wherein the third magnetic material film is disposed between the second magnetic material film and the first non-magnetic layer.

* * * * *